(12) United States Patent
Denison et al.

(10) Patent No.: US 8,853,029 B2
(45) Date of Patent: Oct. 7, 2014

(54) METHOD OF MAKING VERTICAL TRANSISTOR WITH GRADED FIELD PLATE DIELECTRIC

(75) Inventors: Marie Denison, Plano, TX (US);
Sameer Pendharkar, Allen, TX (US);
Philip L. Hower, Concord, MA (US);
John Lin, Chelmsford, MA (US)

(73) Assignee: Texas Instruments Incorporated, Dallas, TX (US)

( * ) Notice: Subject to any disclaimer, the term of this patent is extended or adjusted under 35 U.S.C. 154(b) by 427 days.

(21) Appl. No.: 13/188,162

(22) Filed: Jul. 21, 2011

(65) Prior Publication Data

US 2011/0275210 A1 Nov. 10, 2011

Related U.S. Application Data

(62) Division of application No. 12/426,717, filed on Apr. 20, 2009, now abandoned.

(51) Int. Cl.
*H01L 21/336* (2006.01)
*H01L 29/66* (2006.01)
*H01L 29/78* (2006.01)
*H01L 29/423* (2006.01)

(52) U.S. Cl.
CPC ...... *H01L 29/7813* (2013.01); *H01L 29/66734* (2013.01); *H01L 29/66719* (2013.01); *H01L 29/42368* (2013.01)
USPC ........................... 438/268; 438/270; 438/272

(58) Field of Classification Search
USPC .......... 257/329, 330, 331, 332, 488; 438/268, 438/270, 272
See application file for complete search history.

(56) References Cited

U.S. PATENT DOCUMENTS

| | | | |
|---|---|---|---|
| 6,605,841 B2 | 8/2003 | Lanzerstorfer et al. | |
| 6,806,533 B2 | 10/2004 | Henninger et al. | |
| 7,372,103 B2 | 5/2008 | Zundel et al. | |
| 7,615,847 B2 | 11/2009 | Zundel et al. | |
| 7,642,597 B2 | 1/2010 | Saito | |
| 7,750,397 B2 | 7/2010 | Hirler et al. | |
| 2003/0173618 A1 | 9/2003 | Zundel et al. | |
| 2006/0118864 A1 | 6/2006 | Hirler et al. | |
| 2006/0278922 A1 | 12/2006 | Zundel | |
| 2007/0114600 A1 | 5/2007 | Hirler et al. | |
| 2008/0135930 A1* | 6/2008 | Saito | 257/330 |
| 2008/0197442 A1 | 8/2008 | Hirler et al. | |
| 2009/0039419 A1 | 2/2009 | Zundel et al. | |
| 2009/0114986 A1 | 5/2009 | Hirler et al. | |
| 2009/0206395 A1 | 8/2009 | Hshieh | |
| 2009/0218618 A1 | 9/2009 | Blank et al. | |
| 2010/0087039 A1 | 4/2010 | Hshieh | |
| 2010/0117144 A1 | 5/2010 | Hirler et al. | |
| 2010/0140697 A1 | 6/2010 | Yedinak et al. | |
| 2010/0207206 A1 | 8/2010 | Krischke et al. | |

OTHER PUBLICATIONS

Moens, P., et al., "XtreMOS: The First Integrated Power Transistor Breaking the Silicon Limit", 2006 IEEE 4 Pages.

* cited by examiner

*Primary Examiner* — Ngan Ngo
(74) *Attorney, Agent, or Firm* — Alan A. R. Cooper; Frederick J. Telecky, Jr.

(57) ABSTRACT

An electronic device has a plurality of trenches formed in a semiconductor layer. A vertical drift region is located between and adjacent the trenches. An electrode is located within each trench, the electrode having a gate electrode section and a field plate section. A graded field plate dielectric having increased thickness at greater depth is located between the field plate section and the vertical drift region.

7 Claims, 8 Drawing Sheets

METHOD OF MAKING VERTICAL TRANSISTOR WITH GRADED FIELD PLATE DIELECTRIC

This application is a division of application Ser. No. 12/426,717, filed Apr. 20, 2009, the entirety of which is hereby incorporated by reference.

BACKGROUND

This application is directed, in general, to methods of making semiconductor devices and, more specifically, to methods of making electronic devices employing a vertical drift region.

Trench field plate MOSFET transistors provide a vertical drift region architecture to reduce the area of the transistor. A general objective of MOSFET design is to minimize the specific on-resistance $R_{sp}$ of the transistor, e.g., the product of the device area A and its on-state resistance $R_{on}$. A lower specific on-resistance results in lower area consumption and/or power dissipation during operation.

SUMMARY

One aspect provides an electronic device that has a plurality of trenches formed in a semiconductor layer. A vertical drift region is located between and adjacent the trenches. An electrode is located within each trench, the trench having a gate electrode section and a field plate section. A graded field plate dielectric is located between the field plate section and the vertical drift region.

Another aspect provides a method of forming a vertical MOSFET. The method includes providing a substrate that has a trench formed in a semiconductor layer. A gate dielectric is formed on a sidewall of the trench at a top portion thereof. A field plate dielectric is formed on the sidewall below the gate dielectric. The trench is filled with a field plate material. The field plate dielectric has a portion with a first thickness at a first depth of the trench, and a portion with a greater second thickness at a greater second depth of the trench.

Another aspect provides a vertical field plate trench MOSFET. The MOSFET includes an epitaxial layer having a first conductivity type. A drain region is located in the epitaxial layer and has a second different conductivity type. A plurality of trenches is formed in the drain region. A polysilicon field plate is located within each of the trenches. An oxide field plate dielectric is located between each of the field plates and the drain region. A thickness of the oxide field plate liner is greater adjacent a bottom of the field plates than adjacent a top of the field plates.

BRIEF DESCRIPTION OF THE DRAWINGS

Example embodiments are described with reference to accompanying drawings, wherein.

DETAILED DESCRIPTION OF EXAMPLE EMBODIMENTS

A trench field plate MOSFET includes a number of field plates formed within a drain extension region. The disclosure benefits from the recognition that operating characteristics of a trench field plate MOSFET may be improved by providing a dielectric between the field plates and the drain extension region that has a variable thickness therebetween. The variable thickness is expected to provide a flatter potential distribution in the direction of carrier flow during operation, resulting in increased blocking voltage, for example.

Figure 1:
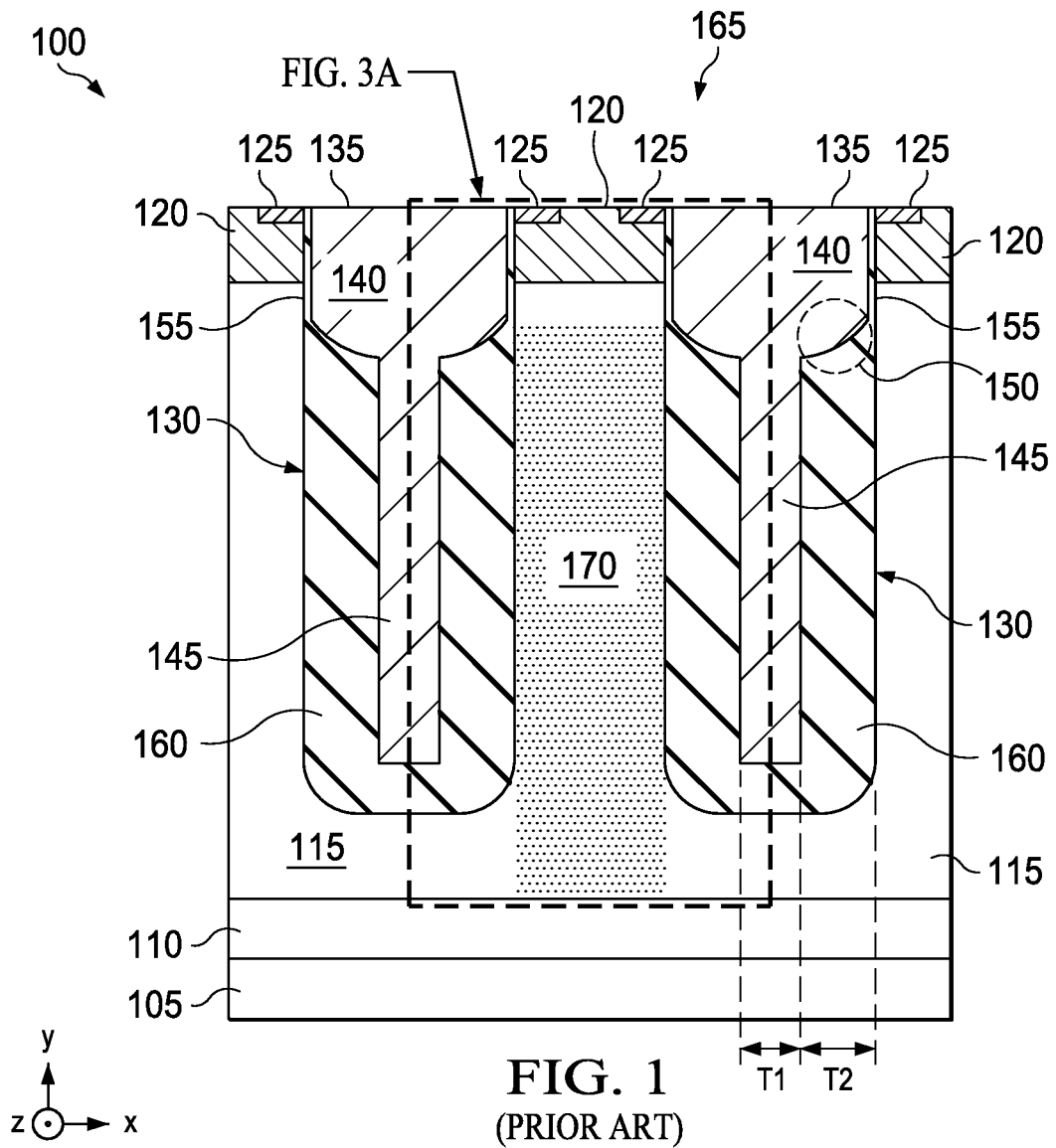
FIG. 1 is a prior art field plate trench MOSFET transistor.

FIG. 1 illustrates a portion of a prior art trench field plate power MOSFET 100. Coordinate axes are shown for reference. The illustrated portion includes a substrate 105 with a drain 110 and a drain extension 115 located thereover. A body 120 (sometimes referred to as a backgate) is located over the extension 115, with a source 125 formed over the body 120. The drain 110, the extension 115 and the source 125 may be of a fist conductivity type, e.g., n-doped, while the substrate 105 and the body 120 may be of a second conductivity type, e.g., p-doped. Typically, the drain 110 is doped with a higher dopant concentration, e.g., about 1E19 $cm^{-3}$, than the extension 115, e.g., about 1E16 $cm^{-3}$. The substrate 105 may be highly doped, e.g., n++ or p++ depending on the polarity of the MOSFET 100.

Located within the extension 115 are trenches 130 with electrodes 135 located therein. Each electrode 135 includes a gate electrode 140 and a field plate 145. The plate 145 is that section of the electrode 135 below a neck region 150 in which the thickness of the electrode 135 decreases to the thickness T1 of the plate 145.

A gate dielectric 155 is located between the electrode 140 and the body 120, while a field plate dielectric 160 is located between the plate 145 and the extension 115. The dielectric 160 has a relatively uniform thickness T2 between the plate 145 and extension 115. A unit cell 165 includes one-half of two adjacent electrodes 135. The MOSFET 100 typically includes N unit cells extending in the ±z direction and arranged, e.g., in a linear array.

The extension 115 may be characterized as including a drain drift region 170 located between the plates 145, the body 120 and the drain 110. The region 170 is a region with a lower doping compared to the drain 110, e.g., in which a drain-source voltage drop occurs during operation. Under appropriate bias conditions, the electrode 140 produces an inversion channel along the sidewalls of the trench 130 adjacent the body 120, connecting the source 125 to the extension 115. Charge carriers may flow in the region 170 in a generally vertical (±y) direction. Thus, the region 170 may be regarded as a vertical drift region.

The plate 145 may be used to modulate the carrier concentration in the region 170. Under high drain voltage, the region 170 is effectively depleted vertically by the body 120 and horizontally by the plate 145. This horizontal depletion of the region 170 allows, for a given maximum drain-source voltage, a designer to increase the doping of the region 170, or to reduce the thickness thereof. Either case reduces the device specific on-resistance compared to a vertical MOSFET that does not employ a trench field plate architecture.

Under some operating conditions, e.g., a sufficiently large drain voltage, a maximum gate-drain voltage is reached at the bottom of the trench 130, so that lateral depletion is maximum at this position. At the top of the region 170, depletion is also important because of the combined effect of the body 120 and the plate 145. As a result of these two effects, the potential drops faster at the top of the region 170 and the bottom of the trench 130 than in the vertical space therebetween.

Figure 3C:
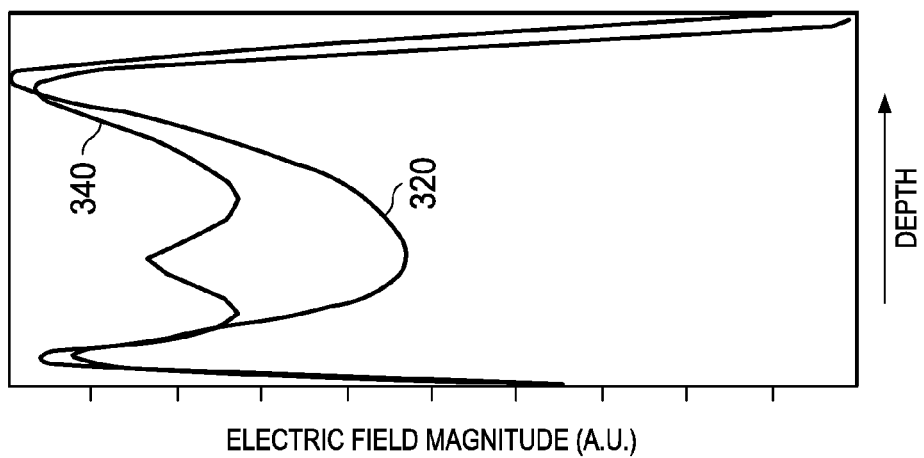
FIGS. 3A-3C illustrate electric potential and electric field profiles.
Figure 3B:
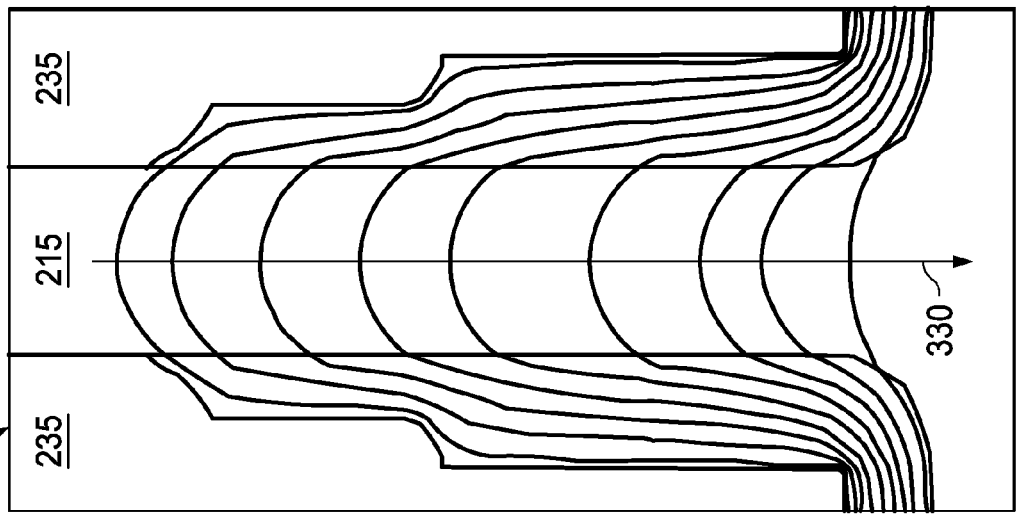
Figure 3A:
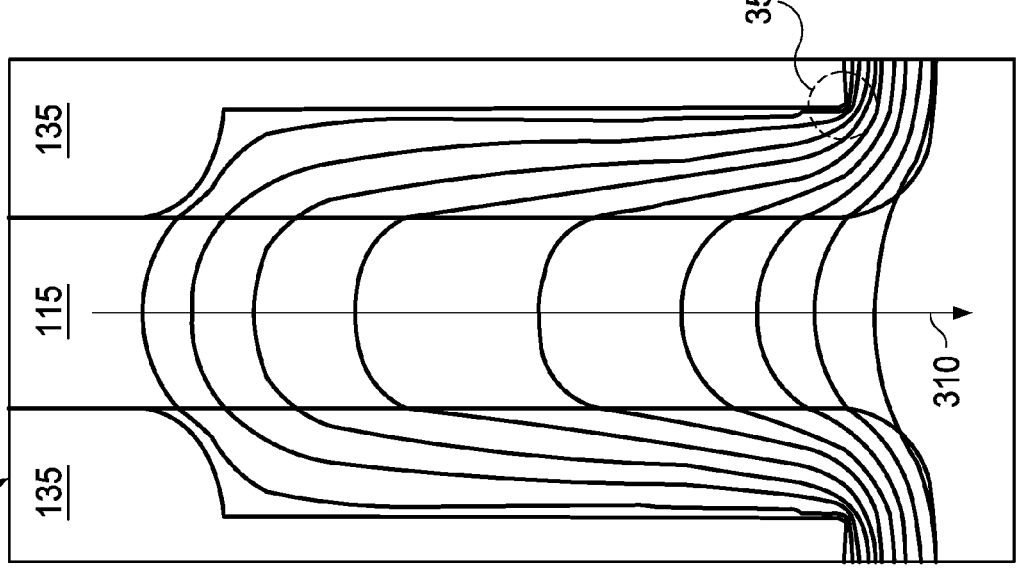

These effects are illustrated in FIG. 3A, in which a computed electric potential distribution within the unit cell 165 is shown. The spacing between electric equipotential lines along a path 310 is associated with the strength of an electric potential distribution therealong. The equipotential lines are initially relatively closely spaced, indicating a relatively high potential gradient, and are less closely spaced about midway along the path 310, indicating a relatively low gradient. Towards the end of the path 310, the gradient is again more relatively greater.

FIG. 3C illustrates an electric field profile 320 associated with the potential distribution of FIG. 3A along the path 310. The profile 320 is characterized by two local maxima associated with the beginning and end of the path 310, and a local minimum about midway along the path 310. The electric field at this minimum is only about half of the value at the maxima.

A power MOSFET may be characterized by its blocking voltage, e.g., the voltage above which source-drain breakdown occurs. A higher blocking voltage is associated with a flatter electric field profile. Thus, the profile 320 is expected to be associated with a relatively low blocking voltage.

Figure 2:
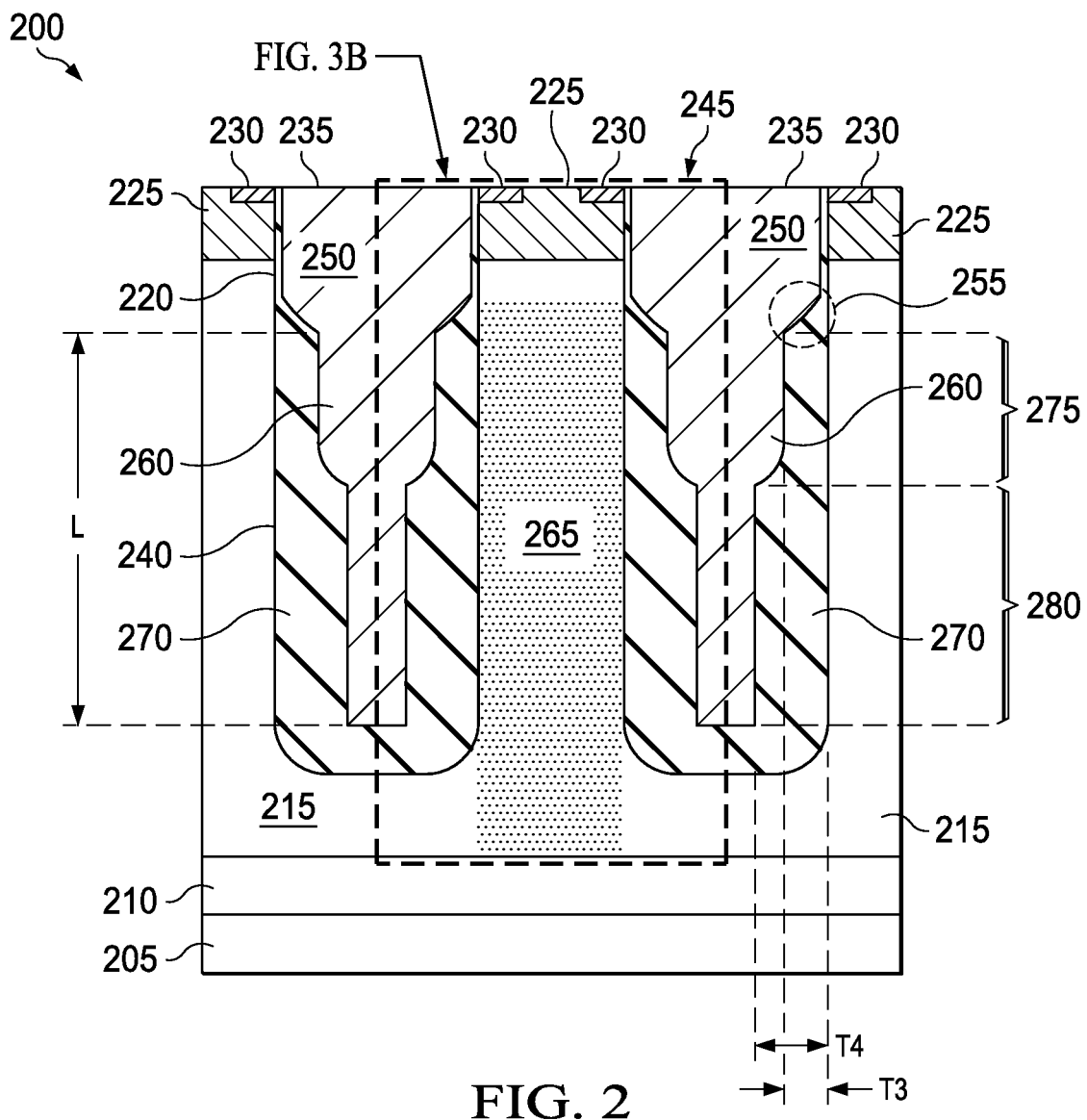
FIG. 2 shows an embodiment of the disclosed MOSFET transistor.

FIG. 2 illustrates a trench field plate power MOSFET 200. MOSFET 200 includes a substrate 205, drain 210, drain extension 215, a gate dielectric 220, a body 225 and a source 230. Electrodes 235 are located in trenches 240 formed within the extension 215. A unit cell 245 includes one-half of two adjacent electrodes 235. Each electrode 235 includes a gate electrode 250 defined as that section of the electrode 235 above a neck region 255 below which the electrode 235 narrows. A section of the electrode 235 below the region 255 is defined as a field plate 260. A drift region 265 is that region of the extension 215 between adjacent plates 260. A field plate dielectric 270 is located between each plate 260 and the region 265.

The electrode 235 may comprise any conductor material. In one embodiment, the electrode 235 is doped polysilicon. In another embodiment, the electrode 235 is a metal material, such as tungsten or copper. In some embodiments, the electrode 235 may include a liner of, e.g., titanium, tantalum and/or a nitride of titanium or tantalum.

The dielectric 270 has a nonuniform thickness over its vertical extent L. As used herein, the field plate dielectric has a nonuniform thickness, e.g., when its thickness varies by about 20% or more over its vertical extent adjacent the plate 260. In the illustrated embodiment, an upper section 275 has a thickness T3, and a lower section 280 has a thickness T4 that is greater than T3. Other embodiments may include, e.g., more than two portions of uniform width, or one or more portions having a nonuniform width, such as a taper from a lesser thickness to a greater thickness with increasing trench depth. A taper may be linear or nonlinear. In some embodiments, the width is monotonic with increasing depth, e.g., the width does not decrease with depth at any location of the dielectric 270. In some embodiments, the dielectric 270 is thick enough at the bottom of the trench 240 to sustain the maximum drain-gate voltage expected at that location during device operation.

In the illustrated embodiment, the plate 260 has a nonuniform thickness that minors the nonuniform thickness of the dielectric 270, e.g., becomes narrower with increasing depth of the trench 240. In other embodiments, the thickness of the field plate may have different profiles, e.g., a constant or increasing thickness, with increasing trench depth.

FIG. 3B illustrates a computed electric potential distribution within the unit cell 245 for the non-limiting case that the dielectric 270 includes two portions each having a different uniform thickness, e.g., such as illustrated in FIG. 2. The electric field associated with the equipotential distribution along a path 330 is plotted in FIG. 3C as an electric field profile 340. As was described for the profile 320, the profile 340 is characterized by two local maxima near the beginning and end point of the path 330. However, the profile 340 is significantly more uniform than the profile 320. The local minimum of the profile 320 is replaced in the profile 340 by two local minima and a local maximum, with the electric field at the minima being at least about 70% of the maximum value near the end points. The different thicknesses of the dielectric 270 provide a means to engineer a more uniform potential distribution in the region 265 by increasing the capacitive coupling of the plate 260 to the region 265 through thinner portions of the dielectric 270 than in the prior art case represented by FIG. 1. Under high drain-source voltage, the plate 260 is expected to more efficiently deplete the region 265 than in the prior art MOSFET 100. It is believed that by employing some of the embodiments of the disclosure, a nonuniformity of the electric field between the end points of path 330, e.g., between the top and the bottom of the region 265, may be limited to no greater than about 20%. In other cases, with careful design the nonuniformity of the electric field may be limited to no greater than about 10%. Use of numerical simulation techniques may guide the design of a field plate profile having desired nonuniformity characteristics.

The dielectric 160 of prior art MOSFET 100 has a single, uniform thickness. The thickness of the oxide below the region 150 is typically designed to resist breakdown in a region 350 (see FIG. 3A) at the bottom of the trench where the electric field is high. The drain-source breakdown voltage $V_b$, and thus the blocking voltage of the MOSFET 100, is limited by the lack of depletion in the region 170.

In contrast, in MOSFET 200, the dielectric 270 is a graded dielectric having at least two different thicknesses, such that the thickness of the dielectric 270 between the plate 260 and the region 265 increases in a step-wise or continuous manner toward the drain 210. As used herein, the term "graded field plate dielectric" includes both an abrupt and a gradual increase of thickness of the dielectric 270 by at least about 20% with increasing depth of the trench 240. In some cases, process conditions may result in a flare of the plate 260 near the bottom of the trench 240. This flare may cause a portion of the dielectric 270 to thin with depth adjacent such a flared section of the plate 260. In such cases, the definition of "graded field plate dielectric" excludes the thinned portion.

The novel configuration resulting from the graded field plate dielectric thickness is expected to result in an increased drain depletion effect and improved (e.g., more uniform) electric field distribution along the region 265 at a drain-source voltage close to a device maximum operating voltage and breakdown voltage. This configuration allows the thickness of the extension 215 to be reduced, or for the doping level of the extension 215 to be increased. In both cases, the device $R_{sp}$ may be reduced, and the constraints on $R_{sp}$ for a given $V_b$ may be relaxed.

Figure 4A:
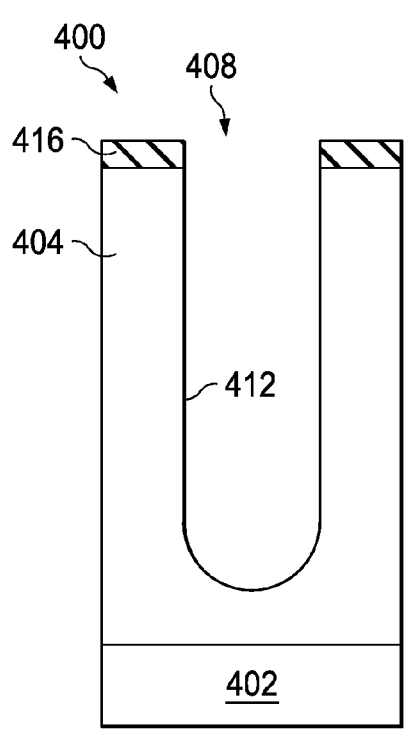
FIGS. 4A-4J, 5A, 5B and 6A-6F illustrate methods of forming embodiments of the disclosure.

FIG. 4A illustrates an embodiment of a method of forming an electronic device 400. The device 400 may be any current or future-conceived electronic device using an architecture that includes a vertical plate electrode adjacent a drift region of a semiconductor substrate. Embodiments presented herein are illustrated without limitation using a power MOSFET as an example electronic device. In FIG. 4A, a substrate 402 is provided with a semiconductor layer 404 thereover. Herein, "provided" means that a device, substrate, structural element, etc., may be manufactured by the individual or business entity performing the disclosed methods, or obtained thereby from a source other than the individual or entity, including another individual or business entity.

An opening 408 with a sidewall 412 is formed within the layer 404. The substrate may be as described previously, including, e.g., a highly doped buried semiconductor layer in contact with the layer 404 that functions as a drain. The layer 404 may be a crystalline semiconductor, and in some cases may be an epitaxial layer formed on a semiconductor substrate. In one embodiment, the layer 404 is an epitaxial layer of a first conductivity type, e.g., n-type, and the substrate 402 is of an opposite second conductivity type, e.g., p-type, with a buried layer (not shown) of the first conductivity type located therebetween. The substrate 402 may include a buried oxide layer, such as semiconductor-on-insulator (SOI) or materials other than the primary elemental constituents of the layer 404.

The opening 408 may be formed conventionally. In some embodiments, a hardmask 416 may be used to aid the definition of the opening 408. In some cases, a portion of the hardmask 416 may remain over the layer 404, as illustrated. In other embodiments, the hardmask 416 may be removed prior to the step illustrated by FIG. 4A. In some embodiments, the opening 408 is formed using a deep reactive ion etch (DRIE) process, alternating anisotropic etch and sidewall passivation (for example, using silicon fluorine or chlorine based etchants and oxygen-based passivation).

Figure 4B:
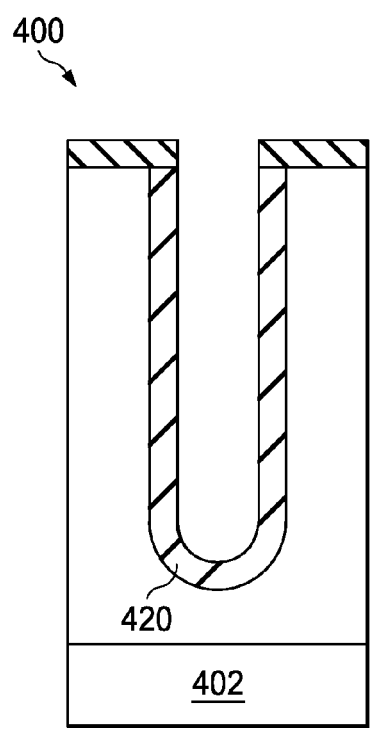

In FIG. 4B, a dielectric liner 420 is formed on the sidewall 412. The liner 420 may be, e.g., a thermal oxide of the layer 404 or other dielectric formed by, e.g., a chemical vapor deposition (CVD) process. The liner 420 may be deposited with any thickness consistent with a desired electrical potential distribution in the region 265, e.g., and allowed by the width of the opening 408 and the ability to fill the opening 408 with a field plate material at a later step. In an example embodiment, the opening 408 may be about 1.5 µm wide and 4 µm deep, and the liner 420 may be a thermal oxide with a thickness of about 600 nm.

Figure 4C:
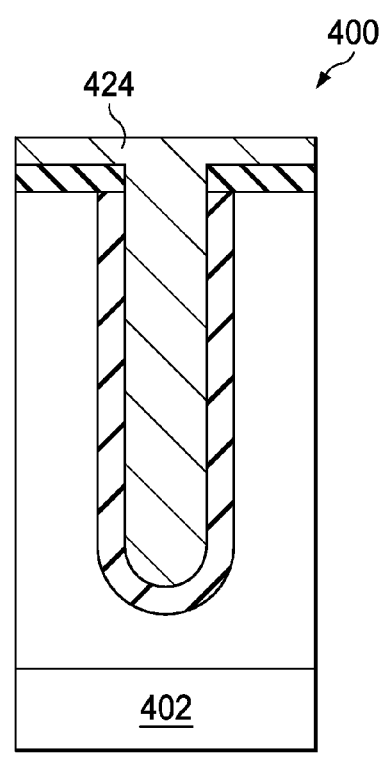

FIG. 4C illustrates the device 400 after forming a filler 424 in the opening 408. The filler 424 may be any material that may be removed at a greater rate than the liner 420, or at a lesser rate that the liner 420, depending on conditions of the removal process. Non-limiting examples include photoresist, an anti-reflective coating (ARC), silicon nitride and polysilicon. In some embodiments, the filler 424 is completely removed in subsequent processing steps. In this context, the filler 424 is regarded as sacrificial. In some embodiments, as described below, a portion of the filler 424 may be removed and a remaining portion left in the opening 408. In such cases, it is preferred that the filler 424 be a conductor or semiconductor material such as, e.g., polysilicon.

Figure 4D:
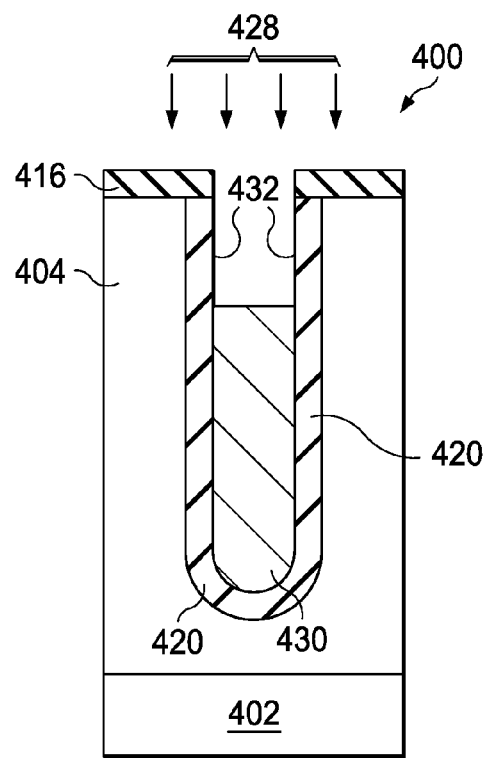

FIG. 4D illustrates the device 400 after a first portion of the filler 424 is removed by an etch process 428. As used herein, an etch process may be any process that is used to controllably remove a portion or an entirety of a material layer. Conventional processes are known to those skilled in the pertinent art to remove these example materials with selectivity to the liner 420. An etch process may include dry (plasma) removal, wet removal, or a combination. It is understood by those skilled in the pertinent art that certain removal processes may include a subsequent clean step that may or may not result in additional removal of the target layer. In FIG. 4D, the removing leaves a remaining portion 430. A portion 432 of the liner 420 is uncovered by the process 428. The process 428 may remove the first portion of the filler 424 at a greater rate than the liner 420, and may also remove the first portion at a greater rate than the hardmask 416 when present.

Figure 4E:
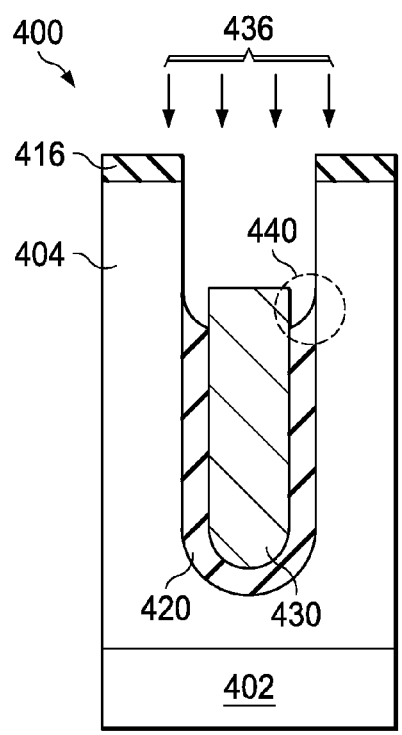

FIG. 4E illustrates the device 400 after removing the portion 432, by, e.g., an isotropic etch process 436. The process 436 may be configured to remove the portion 432 at a greater rate than the portion 430. The process 436 may also be configured to result in a profile 440 of the surface of the liner 420 that is higher where the liner 420 meets the sidewall 412 than where the liner 420 meets the portion 430, to produce a gradual dielectric thickness increase from top to bottom.

Figure 4G:
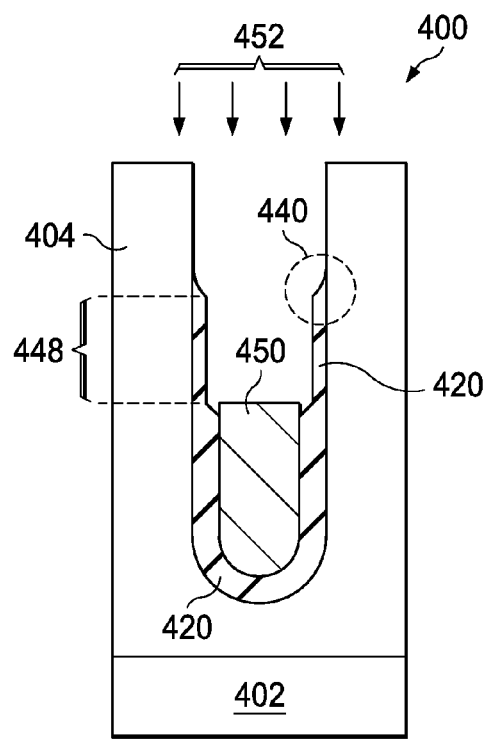
Figure 4F:
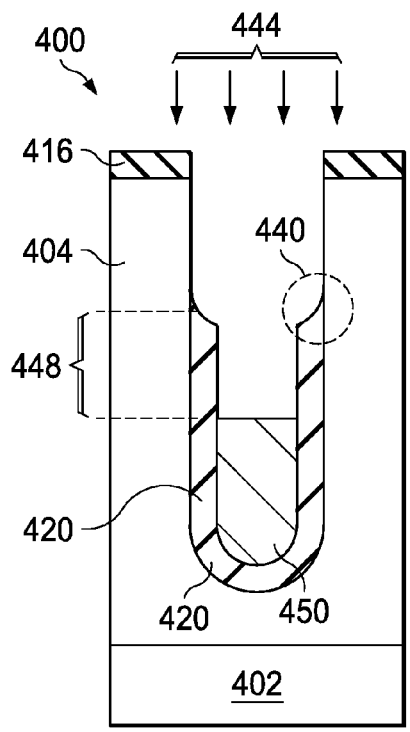

In FIG. 4F, a second portion of the filler 424 is removed by an etch process 444. The removing leaves a remaining portion 450. The process 444 may be a same process as the process 428, e.g., the same tool, chemistry and clean, but need not be. The process 444 may be configured to remove the filler 424 at a greater rate than the liner 420. In some embodiments, the process 444 is configured to preserve the general characteristics of the profile 440. The removing of the portion of the filler 424 results in an uncovered portion 448 of the liner 420.

FIG. 4G illustrates the device 400 after removing a portion of the liner 420 by an etch process 452. In some embodiments, the process 452 is an isotropic etch process. The process 452 may be configured to thin the portion 448 of the liner 420 while retaining the general characteristics of the profile 440. The process 452 may optionally be configured to remove any remaining portions of the hardmask 416, as illustrated in FIG. 4G.

Figure 4H:
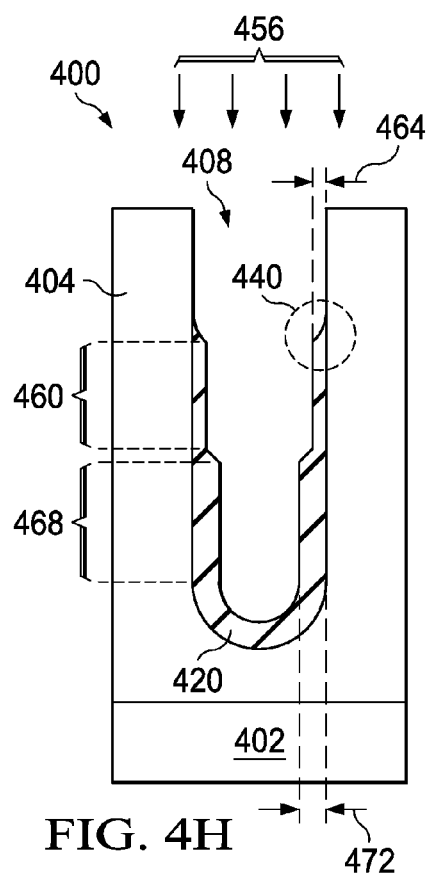

In FIG. 4H, the portion 450 of the filler 424 is removed by an etch process 456. The process 456 may be configured to be selective to the liner 420, thus generally preserving the profile 440.

The profile of the liner 420 is configured to function as a field plate dielectric to cooperate with a field plate formed in a later process step to reduce nonuniformity of electric fields in a vertical drift region of the operational device 400. In particular, the thickness of the liner 420 is graded such that it includes at least an upper portion 460 with a thickness 464 that is thinner than a lower portion 468 with a thickness 472. As a result, the capacitive coupling between the later-formed field plate and the layer 404 is increased at the level of the portion 460 and the lateral drain extension depletion effect is increased relative to the ungraded case of the prior art MOSFET 100. In some embodiments, the thickness 472 of the liner 420 is at least about 20% greater than the thickness 464 of the portion 460.

Figure 4I:
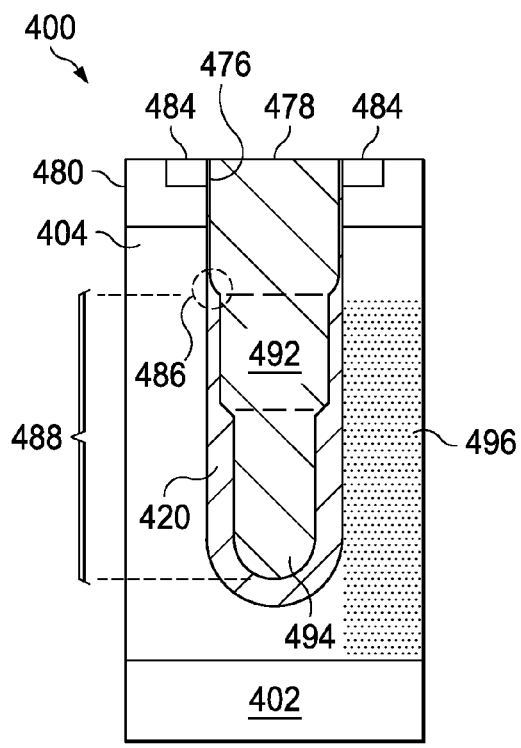

In FIG. 4I, a gate oxide layer 476 has been formed by, e.g., thermal oxidation. An electrode 478 is formed in the opening 408. Conventional implant and anneal processes may be used to form a body 480, a source 484, and a body contact (not shown). The electrode 478 may be, e.g., a conventional conductor or semiconductor material such as described previously with respect to the electrode 235. The electrode 478 may be formed by a conventional process that is designed to fill narrow or high aspect-ratio trenches. Such processes are known to those skilled in the pertinent arts, and may include several deposition and etch steps. While embodiments of the electrode 478 may include gaps and/or seams, generally it is preferred that such imperfections are minimized. When gaps do occur, such may optionally be filled by a dielectric such as a CVD oxide if the gap width is large enough. The electrode 478 may include a neck region 486 below which is located a field plate 488 having an upper region 492 and a lower region 494.

The layer 404 includes a drift region 496. The regions 492, 494 of the plate 488 have a width reduced by twice the thickness of the liner 420 adjacent each respective region 492, 496. The region 492 and the region 496 may each have different thickness that is substantially uniform. The width of the region 492 may be at least 20% greater than the width of the region 494.

The thickness profile of the liner 420 provides the aforementioned advantageous potential and electric field distribution in the region 496. In particular, the plate 478 is expected to have a greater capacitive coupling to the region 496 where the liner 420 is thinner, e.g., the portion 460, and a lower capacitive coupling where the liner 420 is thicker, e.g., the portion 468. In some embodiments, the process described by, e.g., FIGS. 4D though 4H may be optionally repeated to form more than two dielectric liner portions of substantially uniform thickness.

Figure 4J:
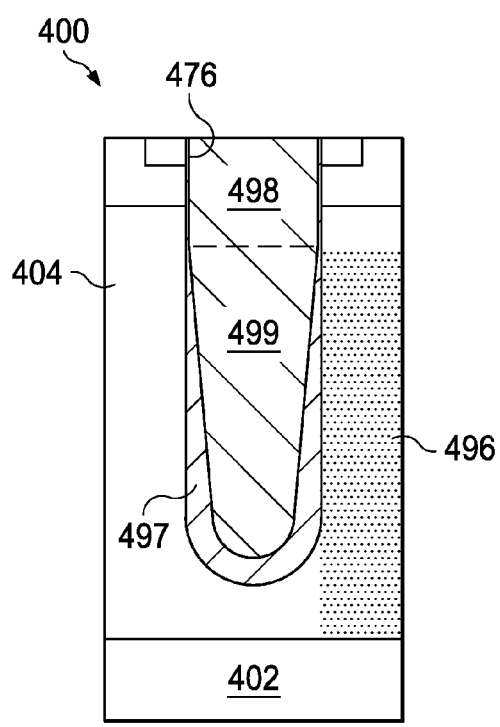

FIG. 4J illustrates an alternate embodiment of the device 400 having a field plate dielectric 497, a gate electrode 498 and a field plate 499. The dielectric 497 has a thickness that increases from top to bottom of the region 496, but in a more continuous manner than for the liner 420. In some cases, the dielectric 497 has a thickness that increases about linearly with depth adjacent the region 496. Parameters such as chemistry, pressure, power and temperature of an etch process may be determined by those skilled in the etching arts to provide a more isotropic etch than the process 456 to result in the more linear profile of the dielectric 497. The more linear profile of the dielectric 497 may provide a nearly uniform electric field over the region 496 in the direction of carrier flow.

Figure 5A:
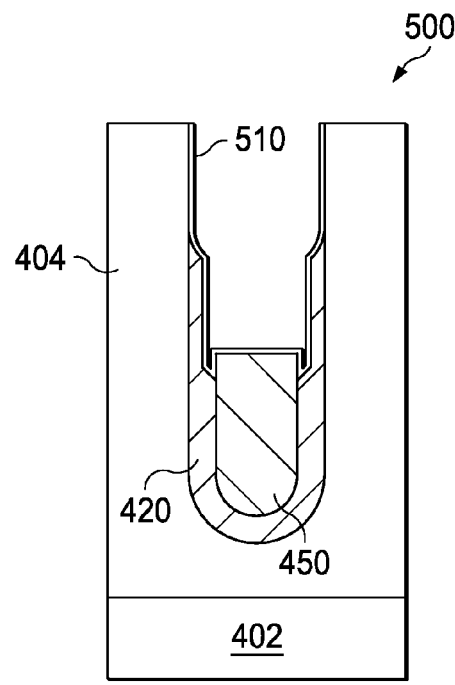

FIG. 5A illustrates, with continuing reference to FIG. 4G, a device 500 in which a dielectric layer 510 is formed over the portion 450 of the filler 424. Starting from the device 400 processed through FIG. 4G, the layer 510 is formed on exposed portions of the liner 420, the portion 450 and the layer 404. The layer 510 may include a compound formed with the underlying composition, e.g., silicon dioxide over silicon or germanium dioxide over germanium. The layer 510 may be formed, e.g., by thermal oxidation or a CVD process.

Figure 5B:
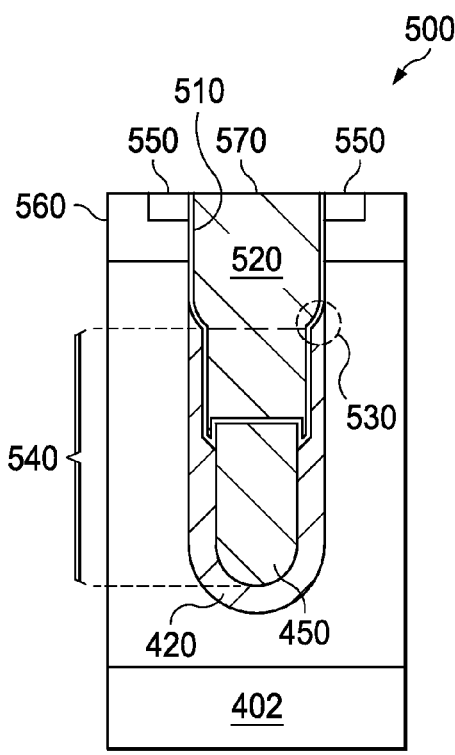

In FIG. 5B, an upper electrode 520 has been formed over the layer 510, and may be formed by the methods described with respect to the plate 488. The electrode 520 and the portion 450 may act together as an electrode 570. The combination of the electrode 520 below a neck region 530, the portion 450 and the layer 510 therebetween constitutes a field plate 540. In this context, the portion 450 may be referred to herein as the deep region of the plate 540, and the electrode 520 below the region 530 may be referred to as the shallow region of the plate 540. Sources 550 and a body 560 may be formed in a conventional manner.

In some embodiments, the portion 450 is left electrically floating. In such cases, the portion 450 is capacitively coupled to the electrode 520 of the plate 540 by the layer 510. In other embodiments a conductive path may be made between the electrode 520 and the portion 450 in later process steps that may be conventional. In one embodiment, a portion of the filler 424 is masked to remain unetched at one or more locations of the device 400 thereby providing a connection between the electrode 520 and the portion 450.

In some embodiments, the portion 450 of the field plate is connected to a node different from the gate. For example, to reduce gate-to-drain capacitance it may be advantageous to connect the portion 450 to a voltage node other than the gate. For example, the portion 450 may be connected to the power supply ground. In this case, capacitive loading on the channel is expected to be reduced. Thus, when the drain or the gate is switched from one voltage state to another, charging effects that may slow channel operation are expected to be reduced relative to the case in which the portion 450 is not grounded. It is expected that these and similar embodiments may reduce the parasitic capacitance between the layer 404 and the plate 540, relative to the configuration of FIG. 4I. Such a reduction of capacitance may allow a greater switching speed of the device 500 relative to the device 400.

Figure 6A:
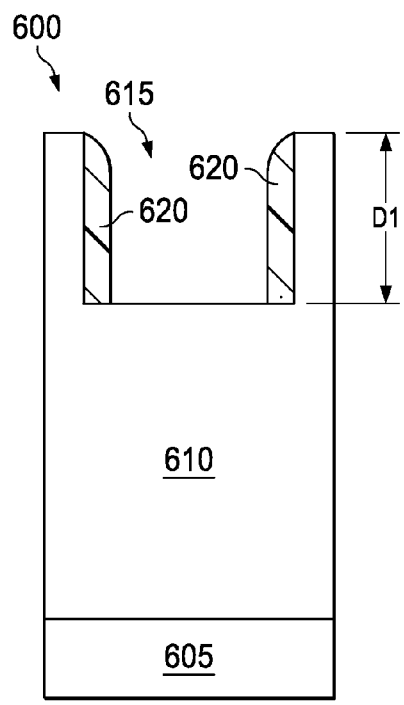

FIGS. 6A-6H illustrate an embodiment of a method for forming an electronic device 600. In FIG. 6A, a substrate 605 is provided with a semiconductor layer 610 thereover. The substrate 605 may be, e.g., a silicon handle wafer of a first conductivity type, and the layer 610 may be, e.g., an epitaxial layer having of a second conductivity type. The characteristics of the layer 610 may be as described for the layer 404. A buried layer of the second conductivity type may be located between the layer 610 and the substrate 605.

An opening 615 with a depth D1 is formed in the layer 610. The opening 615 may be one of a periodic array of such openings, such as, e.g., a linear array of trenches. The opening may be formed conventionally using, e.g., photoresist and plasma etch. A hard mask and/or antireflective coating (ARC), not shown, may optionally be used during formation of the opening 615 at an earlier process step.

First mask layers 620 are located on the sidewalls of the opening 615. The layers 620 are formed of a material that may be selectively removed at a later processing step without significantly eroding a later-formed field plate dielectric. In a non-limiting example, when the field plate dielectric is silicon dioxide, the layers 620 may be silicon nitride or silicon oxynitride. The layers 620 may be formed by depositing a conformal layer of a spacer material by a CVD process. After deposition of the spacer material, the layer 610 may be exposed by removing the spacer material at the bottom of the opening 615. Such removal may be done by an anisotropic etch such as, e.g., DRIE. Those skilled in the pertinent art may determine etch process conditions appropriate for the pitch, density and depth of the opening 615 and neighboring openings (not shown).

Figure 6C:
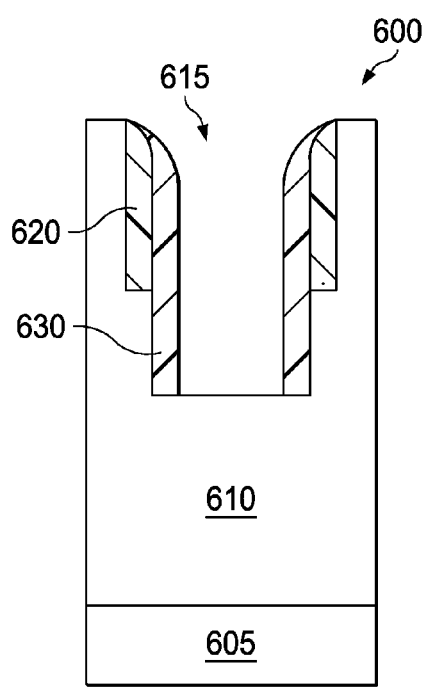
Figure 6B:
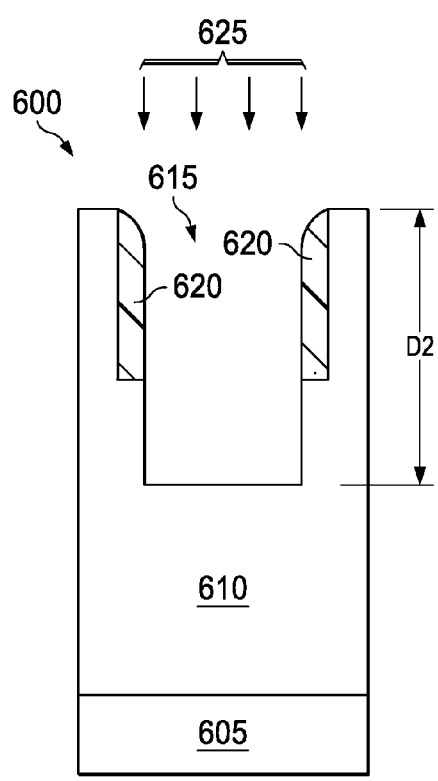

In FIG. 6B, the device 600 has been further processed with an etch process 625 to remove an additional portion of the layer 610. The removing may be done by a conventional DRIE process configured to selectively remove the layer 610 at a greater rate than other exposed material layers such as, e.g., photo resist or a hard mask. The additional removal of the layer 610 deepens the opening 615 to a depth D2.

In FIG. 6C, second mask layers 630 have been formed over the layer 620 and the sidewalls of the opening 615 exposed by the process 625. The layers 630 may be conventionally formed as for the first mask layers, e.g., a conformal silicon nitride or silicon oxynitride layer followed by a DRIE etch. In some cases, the layers 620, 630 are formed of the same material, while in other cases they are formed of different materials.

Figure 6D:
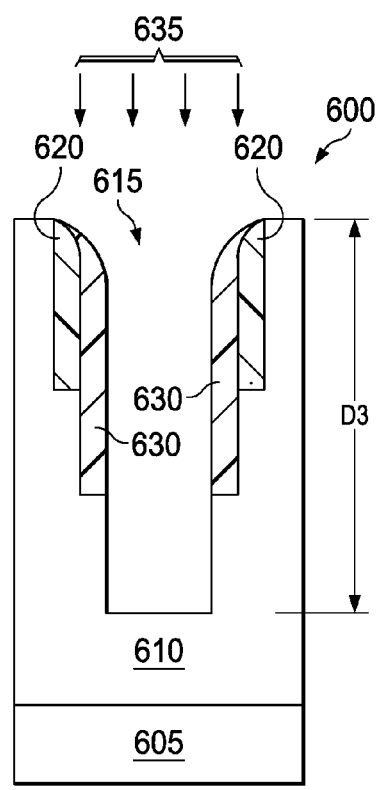

FIG. 6D illustrates the device 600 after an additional portion of the layer 610 has been removed at the bottom of the opening 615 by an etch process 635. The removing results in a depth D3 of the opening 615. The process 635 process may be a DRIE process or other suitable anisotropic etch process.

Figure 6E:
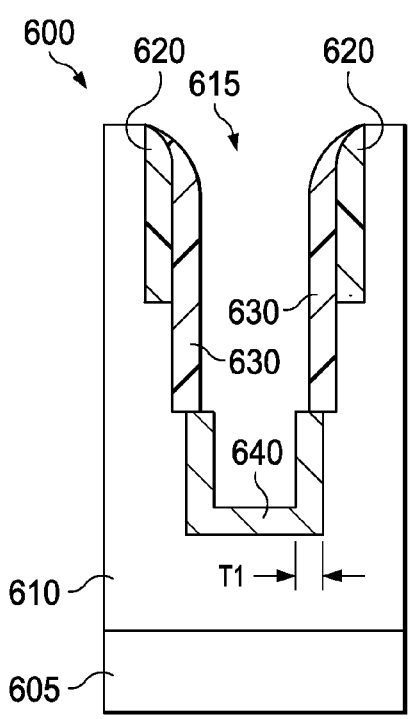

In FIG. 6E, a first dielectric portion 640 has been formed on the sidewall of the opening 615 exposed by the process 635. The formation process may be a conventional thermal oxidation, e.g. The forming process is configured to result in a thickness T1. After forming the portion 640, the layers 630 are removed using a conventional process selective to the portion 640. Those skilled in the pertinent art may configure an isotropic etch process, e.g., to remove the layers 630 at a greater rate than the portion 640. For example, when the layers 630 are formed of silicon nitride and the portion 640 is formed of silicon dioxide, a conventional etch process with high selectivity to silicon dioxide may remove the silicon nitride layers 630. The removing exposes that portion of the sidewall of the opening 615 that was in contact with the layers 630.

Figure 6G:
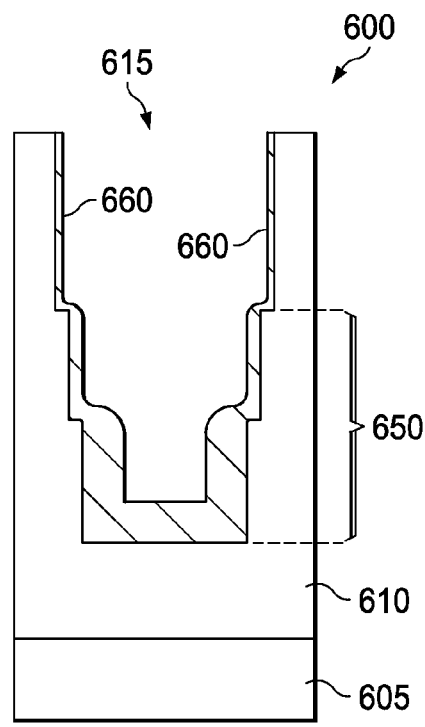
Figure 6F:
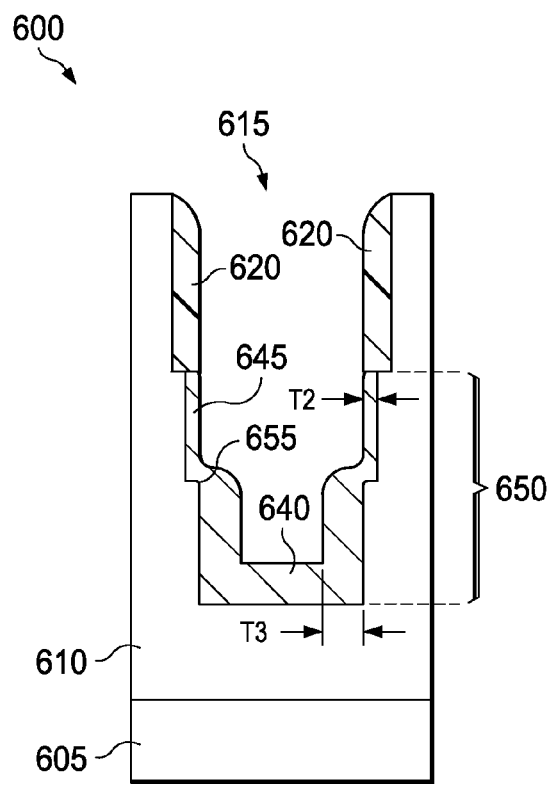

The device 600 is illustrated in FIG. 6F after a second dielectric portion 645 has been formed on the sidewall of the opening 615 exposed by the removal of the layers 630. The combined portions 640, 645 are referred to as field plate dielectric 650. The portion 645 may again be formed by a conventional thermal oxidation process. The forming process is configured to result in a thickness T2 of the portion 645. The portion 640 also typically becomes thicker during this thermal oxidation step, with a thickness T3. In an example embodiment, the thickness T2 is about 300 nm, and the thickness T3 is about 600 nm. One skilled in the pertinent art can determine appropriate process conditions to produce such thicknesses.

A corner 655 at the step from the smaller to the larger width of the opening 615 can be rounded by the second substrate etch process. With appropriate choice of the spacer and spacer thickness, the oxide at the transition from the portion 640 to the portion 645 is expected to be relatively smooth and defect-free. Thus, an electric field produced at the corner during operation of the completed device 600 will be reduced relative to the case of a sharper corner, and the dielectric adjacent the corner is expected to have a high breakdown strength.

In some embodiments, the dielectric 650 may be formed with more than one dielectric material layer. For example, the dielectric 650 may include a layer of silicon dioxide and a layer of silicon nitride. In one embodiment, a layer of CVD silicon nitride is formed over a layer of thermally grown oxide. Such a configuration may be advantageous when a greater capacitive coupling is desired between the plate 260 and the extension 215 (see FIG. 2).

Turning to FIG. 6G, the layers 620 have been removed by an isotropic etch process that may, but need not be, the same process as that used to remove the layers 630. The removing exposes the sidewall of the opening 615 in contact with the layer 620. The device 600 is again exposed to a conventional thermal oxidation process. The oxidation process grows a gate oxide layer 660 that is a continuous extension of the dielectric 650.

Figure 6H:
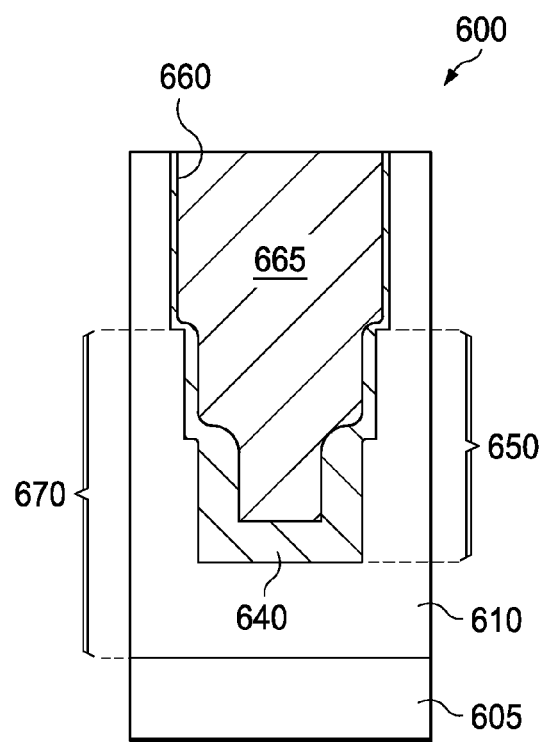

In FIG. 6H, a field plate 665 has been formed in the opening 615. The plate 665 may have the same general characteristics of the plate 488. As was described with respect to the electronic device 400, the profile of the dielectric 650 is expected to result in a more uniform electric field distribution in a drift region 670 adjacent the dielectric 650. The process sequence described by FIGS. 6B through 6F may be optionally repeated to form a greater number of liner thicknesses when desired. In some cases, such a configuration may result in greater uniformity of the electric field in the region 670.

Those skilled in the art to which this application relates will appreciate that variations may be made to the described embodiments and that other embodiments are possible within the scope of the claimed invention.

What is claimed is:

1. A method of forming a vertical MOSFET, comprising:
providing a semiconductor layer over a substrate, said semiconductor layer having a trench formed therein;
forming a gate dielectric on a top portion of a sidewall of said trench;
forming a field plate dielectric on a bottom portion of said sidewall, said field plate dielectric having a first portion with a first thickness at a first depth of said trench, and a second portion with a greater second thickness at a greater second depth of said trench; and
filling said trench with a field plate material,
wherein forming said field plate dielectric comprises:
forming a dielectric layer on said sidewall;
filling said trench with a sacrificial filler material;
removing a first portion of said sacrificial filler material, thereby exposing an upper portion of said dielectric layer; and
at least partially removing said exposed upper portion of said dielectric layer,
removing a second portion of said sacrificial filler material, thereby exposing a lower portion of said dielectric layer and leaving a remaining portion of said sacrificial filler material;
partially removing said exposed lower portion of said dielectric layer, leaving a remaining portion of said dielectric layer on said sidewalls; and
removing said remaining portion of said sacrificial filler material.

2. The method recited in claim 1, wherein forming said field plate dielectric comprises removing a portion of a dielectric layer formed over said sidewall.

3. The method recited in claim 2, wherein forming said field plate dielectric further comprises removing a portion of a filler material thereby exposing said removed portion of said dielectric layer.

4. The method recited in claim 1, further comprising forming a gate oxide on said sidewall after forming said portions of said field plate dielectric.

5. A method of forming an electronic device, comprising
providing a substrate with a buried layer of a first conductivity type defining a drain, and a semiconductor layer of lower doping of the first conductivity type over the drain;
forming a vertically elongated opening with a sidewall in the semiconductor layer, the opening having a greater depth than width;
forming a dielectric liner on the sidewall within the opening;
forming a filler over the liner within the opening;
removing a first portion of the filler and uncovering a first portion of the liner in an upper part of the opening, leaving a remaining portion covering the liner in a bottom part of the opening;
removing the first portion of the liner in the upper part of the opening, whereby a profile of the surface of the liner is higher where the liner meets the sidewall than where the liner meets the remaining portion of the filler material, to produce a gradual thickness increase from top to bottom;
removing a second portion of the filler and uncovering a second portion of the liner in a middle part of the opening, leaving a remaining portion covering the liner in the bottom part of the opening;
thinning the second portion of the liner in the middle part of the opening, whereby a profile of the surface of the liner is higher where the liner meets the sidewall than where the liner meets the remaining portion of the filler material, to produce a gradual thickness increase from top to bottom; and
removing a third portion of the filler and uncovering a third portion of the liner in the bottom part of the opening;
the profile of the liner defining a field plate dielectric; and
the thickness of the liner being graded such that it includes at least an upper portion with a thickness that is thinner than a lower portion thickness, whereby capacitive coupling between the field plate and the layer is increased at the level of the upper portion.

6. A method of forming an electronic device that includes a vertical plate electrode adjacent a drift region of a semiconductor substrate, comprising:
forming an opening within a semiconductor layer of a substrate;
forming a liner on the sidewall of the opening;
forming a filler over the liner within the opening;
removing an upper portion of the filler from the opening, thereby uncovering an upper portion of the liner;

removing the uncovered upper portion of the liner from the opening;

after removing the uncovered upper portion of the liner, removing an intermediate portion of the filler from the opening, thereby uncovering an intermediate portion of the liner;

removing a part of the uncovered intermediate portion of the liner, to thin the uncovered intermediate portion of the liner;

after thinning the uncovered intermediate portion of the liner, removing a lower portion of the filler, thereby uncovering a lower portion of the liner; a remaining part of the uncovered intermediate portion of the liner being thinner than the uncovered lower portion of the liner;

after removing the lower portion of the filler, filling the opening over the remaining part of the intermediate portion and over the uncovered lower portion with a conductive material, thereby defining an electrode located over a field plate having an upper region and a lower region; the upper region having a width less than a corresponding width of the electrode, and the lower region having a width less the width of the upper region.

7. The method of claim 6, further comprising forming a gate oxide layer over the sidewall of the opening after removing the uncovered upper portion; and wherein filling the opening includes filling the opening over the gate oxide layer.

* * * * *